US006696998B2

(12) United States Patent
Ying et al.

(10) Patent No.: US 6,696,998 B2
(45) Date of Patent: Feb. 24, 2004

(54) APPARATUS FOR GENERATING AT LEAST ONE DIGITAL OUTPUT SIGNAL REPRESENTATIVE OF AN ANALOG SIGNAL

(75) Inventors: Feng Ying, Plano, TX (US); Franco Maloberti, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/159,187

(22) Filed: May 30, 2002

(65) Prior Publication Data

US 2003/0222805 A1 Dec. 4, 2003

(51) Int. Cl.[7] ................................................ H03M 3/00
(52) U.S. Cl. ....................................................... 341/143
(58) Field of Search ......................................... 341/143

(56) References Cited

U.S. PATENT DOCUMENTS 6,121,910 A * 9/2000 Khoury et al. ............... 341/143

OTHER PUBLICATIONS

"Switched–Capacitor Bandpass Delta–Sigma A/D Modulation at 10.7 MHz", by Frank W. Singor and W. Martin Snelgrove; IEEE Journal of Solid–State Circuits; vol. 30, No. 3; Mar. 1995; pp. 184–192.
"A 40 MHz IF Fourth–Order Double–Sampled SC Bandpass Modulator", by Seyfi Bazarjani and Martin Snelgrove; 1997 IEEE International Symposium on Circuits and Systems; Jun. 9–12, 1997, Hong Kong; pp. 73–76.
"A Fourth Order Bandpass Delta–Sigma Modulator with Reduced Number of Op Amps", by Bang–Sup Song; IEEE Journal of Solid–State Circuits; Vol, 30, No. 12; Dec. 1995; pp. 1309–1315.

"A Two–Path Bandpass Modulator for Digital IF Extraction at 20 MHz", by Adrian K. Ong and Bruce A. Wooley; IEEE Journal of Solid–State Circuits; vol. 32, No. 12; Dec. 1997; pp. 1920–1934.
"An 81—MHz IF Receiver in CMOS", by Armond Hairapetian; IEEE Journal of Solid–State Circuits; vol. 31, No. 12; Dec. 1996; pp. 1981–1986.
"A 30 mW Pseudo–N–Path Sigma–Delta Band–Pass Modulator", by Fabrizio Francesconi, Giuseppe Caiulo, Valentino Liberali and Franco Maloberti; 1996 IEEE Symposium on VLSI Circuits Digest of Technical Papers; pp. 60–61.
"A 13.5 mW, 185 MSample/s –Modulator for UMTS/GSM Dual–Standard IF Reception", by Thomas Burger and Qiuting Huang; 2001 IEEE International Solid–State Circuits Conference/Session 3.

* cited by examiner

*Primary Examiner*—Howard L. Williams
(74) *Attorney, Agent, or Firm*—W. Daniel Swayze, Jr.; W. James Brady; Frederick J. Telecky, Jr.

(57) ABSTRACT

An apparatus for generating a digital signal representative of an analog signal includes two signal conversion devices, each having an analog signal section coupled with an input locus and a digital signal section coupled between the analog signal section and an output locus. The signal conversion devices receive sampled analog signals that are phase-offset by a first phase difference. Two feedback devices are each coupled between the output locus of one signal conversion device and the analog signal section of the other signal conversion device to convey feedback signals that are phase-offset by a second phase difference. The first phase difference and the second phase difference cooperate to affect power density spectrum of a resultant digital output signal at at least one predetermined frequency. The resultant digital output signal is a summing of a digital output signals presented by the two signal conversion devices at their output loci.

19 Claims, 6 Drawing Sheets

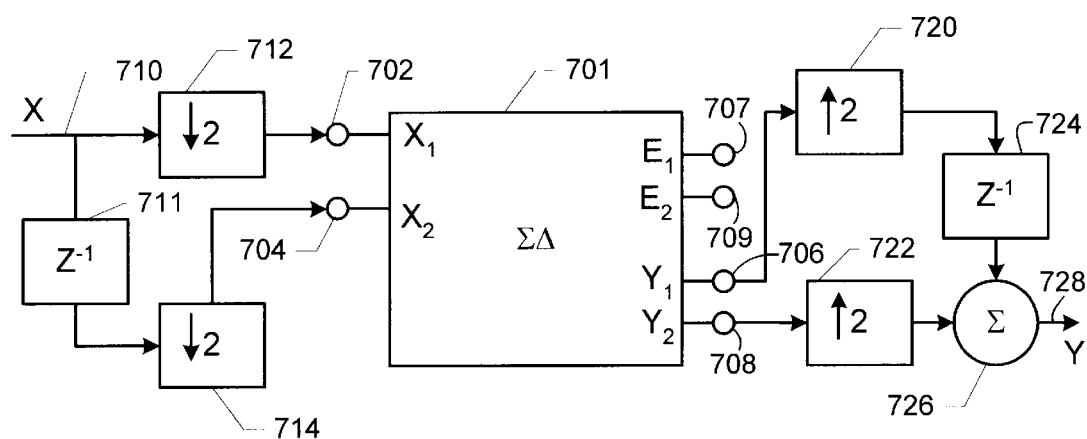
FIG. 7    700

APPARATUS FOR GENERATING AT LEAST ONE DIGITAL OUTPUT SIGNAL REPRESENTATIVE OF AN ANALOG SIGNAL

BACKGROUND OF THE INVENTION

The present invention is directed to analog-to-digital conversion devices, and especially to sigma delta ($\Sigma\Delta$) modulator devices that can be used for analog-to-digital conversion operations.

Recent advances in communication technology have generated interest in performing analog-to-digital signal conversion earlier in the receiver channel than has been effected heretofore. Early analog-to-digital (A/D) conversion at either an intermediate frequency (IF) or radio frequency (RF) stage permits more programmability and simplifies the implementation of multi-standard systems. Such multi-standard systems are more and more in demand of late. In modern communication systems, usually both in-phase and quadrature signals (I/Q signals) exist in a given signal band. A conventional communication channel converts the band-pass signal into two low-pass I/Q channels before A/D conversion. Mismatches between the various analog channels can degrade system performance. A/D conversion at IF permits a more robust digital I/Q separation. Early conversion also serves to relax analog filter design requirements and eliminate some expensive external components.

Several constructions are known for band-pass $\Sigma\Delta$ modulators. One approach is to obtain a transfer function either by transforming a low-pass prototype or by generalized filter approximation. One can then implement the resulting transfer function using appropriate circuit technology, such as by using a switched capacitor circuit. There are two significant drawbacks to such a straightforward design configuration. First, such a design requires accurate circuit components so that the design will strongly depend upon accurate, generally more expensive components. It is quite difficult to design a high-resolution band pass $\Sigma\Delta$ modulator with technology currently available. A second drawback is related to the fact that signal bandwidth is getting higher and higher in products encountered in today's marketplace. Thus, any circuit that is to be used in today's market should be capable of operating at very high frequencies in order to obtain an acceptable oversampling ratio.

Another known design approach to band-pass $\Sigma\Delta$ modulators involves a time-interleaved multi-path approach. Since n-path architecture effectively performs a transformation of $z^{-1} \rightarrow z^{-n}$ to a transfer function, if each path implements a low pass or a high pass $\Sigma\Delta$ modulation, the resulting system can be a band pass system. In such manner techniques used for stable and linear low pass or high pass $\Sigma\Delta$ modulator design can be used in a band pass $\Sigma\Delta$ modulator. Most such designs do not require highly accurate circuit components.

Multi-path $\Sigma\Delta$ systems provide a further advantage in that each path only needs to operate at a fraction of the effective sampling frequency. This enables the practical design of a $\Sigma\Delta$ modulator for a contemporary communication system that could have an intermediate frequency (IF) of 70 MHz–400 MHz. In addition, since power of an operational amplifier is proportional to the square of the operation speed n-path architecture can conserve power to a significant degree.

Some applications, such as third generation mobile telephone applications, use channels requiring large bandwidth. Moreover, the base station architectures in such systems use high intermediate frequencies to permit flexibility in the effecting of digital signal processing. For these reasons it is desirable to use analog-to-digital converters with very large bandwidth (e.g., up to the intermediate frequency used in such systems—around 800–100 MHz) and having high resolution. In the alternative it is possible to use band pass data converters and exploit the oversampling permitted by the ratio between the intermediate frequency and the signal band. However, since the base stations in such systems require converting some third generation channels, the signal band is on the order of 5 MHz, so oversampling is limited to relatively small values.

The use of high speed bipolar technologies allows a designer to achieve high-resolution Nyquist-rate analog-to-digital conversion, typically used in pipeline architectures, with a high sampling rate (typically about 100 MHz or more) and good linearity. However, achieving high linearity across the entire Nyquist band is a significant design challenge and normally requires expensive on-chip trimming or complex calibration operations.

Using band-pass $\Sigma\Delta$ modulators for performing analog-to-digital conversion of intermediate frequency (IF) signals has advantages with respect to Nyquist rate architectures of the sort discussed above. For example, it is possible to use CMOS (complementary metal oxide silicon) technologies in fabricating components for use in such applications. It is possible to integrate the modulator with complex digital circuitry using CMOS devices. Further, a resulting analog to digital converter (ADC) could be much less expensive using CMOS devices than using bipolar components.

Some types of switched capacitor band pass $\Sigma\Delta$ modulators have limitations that render them unsuitable for meeting high IF and high resolution requirements. Some examples of such modulators are described in (1) "Switched-Capacitor Bandpass Delta-Sigma A/D Modulation at 10.7 MHz", by Frank W. Singor and W. Martin Snelgrove; IEEE Journal of Solid-State Circuits; Vol. 30, No. 3; March 1995; pp. 184–192; (2) "A 40 MHz IF Fourth-Order Double-Sampled SC Bandpass $\Sigma\Delta$ Modulator", by Seyfi Bazarjani and Martin Snelgrove; 1997 IEEE International Symposium on Circuits and Systems; Jun. 9–12, 1997, Hong Kong; pp. 73–76; (3) "A Fourth Order Bandpass Delta-Sigma Modulator with Reduced Number of Op Amps", by Bang-Sup Song; IEEE Journal of Solid-State Circuits; Vol, 30, No. 12; December 1995; pp. 1309–1315; (4) "A Two-Path Bandpass $\Sigma\Delta$ Modulator for Digital IF Extraction at 20 MHz", by Adrian K. Ong and Bruce A. Wooley; IEEE Journal of Solid-State Circuits; Vol. 32, No. 12; December 1997; pp. 1920–1934; (5) "An 81-MHz IF Receiver in CMOS", by Armond Hairapetian; IEEE Journal of Solid-State Circuits; Vol. 31, No. 12; December 1996; pp. 1981–1986; (6) "A 30 mW Pseudo-N-Path Sigma-Delta Band-Pass Modulator", by Fabrizio Francesconi, Giuseppe Caiulo, Valentino Liberali and Franco Maloberti; 1996 IEEE Symposium on VLSI Circuits Digest of Technical Papers; pp. 60–61; and (7) "A 13.5 mW, 185 MSample/s $\Sigma\Delta$-Modulator for UMTS/GSM Dual-Standard IF Reception", by Thomas Burger and Qiuting Huang; 2001 IEEE International Solid-State Circuits Conference/Session 3. The representative $\Sigma\Delta$ modulators described in the above references require a clock frequency significantly higher than the intermediate frequency (IF) or path mismatches within the modulator apparatus produce tones in the band-pass.

Typically, for a 2-path modulator, tones are generated about zero, $\frac{f_s}{4}, \frac{f_s}{2}, \frac{3f_s}{4},$ and $f_s$, where $f_s$ is the sampling frequency. It is desirable to situate the center frequency $f_o$ at a frequency where the quanitization noise power of the apparatus is at a minimum value, without encountering tones that are generated by path mismatches.

There is a need for an analog-to-digital apparatus that can achieve the above described desirable features: establish the center frequency at an appropriate Nyquist level where quantization noise power is at a minimum while avoiding mismatch generated tones. The apparatus of the present invention achieves both of the desirable features recited above using a novel cross-coupled architecture employing two $\Sigma\Delta$ modulators.

SUMMARY OF THE INVENTION

An apparatus for generating at least one digital signal representative of an analog input signal includes: (a) a first signal conversion device that includes a first analog signal treatment section coupled with a first input locus and a first digital signal treatment section coupled between the first analog signal treatment section and a first output locus;

the first signal conversion device receives a first sampled analog signal derived from the analog input signal at the first input locus; (b) a second signal conversion device that includes a second analog signal treatment section coupled with a second input locus and a second digital signal treatment section coupled between the second analog signal treatment section and a second output locus; the second signal conversion device receives a second sampled analog signal derived from the analog input signal at the second input locus; the first sampled analog signal and the second sampled analog signal are phase-offset by a first phase difference; (c) a first feedback device coupled between the first output locus and the second analog treatment section; the first feedback device asserts a first delay to first feedback signals conveyed from the first output locus to the second analog treatment section; and (d) a second feedback device coupled between the second output locus and the first analog treatment section; the second feedback device asserts a second delay to second feedback signals conveyed from the second output locus to the first analog treatment section; the first delay and the second delay are phase-offset by a second phase difference. The first phase difference and the second phase difference cooperate to affect power density spectrum of a resultant digital output signal at at least one predetermined frequency. The resultant digital output signal is derived from a summing of a first digital output signal presented by the first signal conversion device at the first output locus and a second digital output signal presented by the second signal conversion device at the second output locus.

It is, therefore, an object of the present invention to provide an apparatus for generating at least one digital signal representative of an analog input signal that permits establishing a center frequency at an appropriate Nyquist level where quantization noise power is at a minimum while avoiding mismatch generated tones.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 7 is a schematic diagram illustrating a representative employment of the apparatus illustrated in FIG. 5 in a system for effecting analog-to-digital signal conversion.

DETAILED DESCRIPTION OF THE PREFERRED EMBODIMENT

Figure 1:
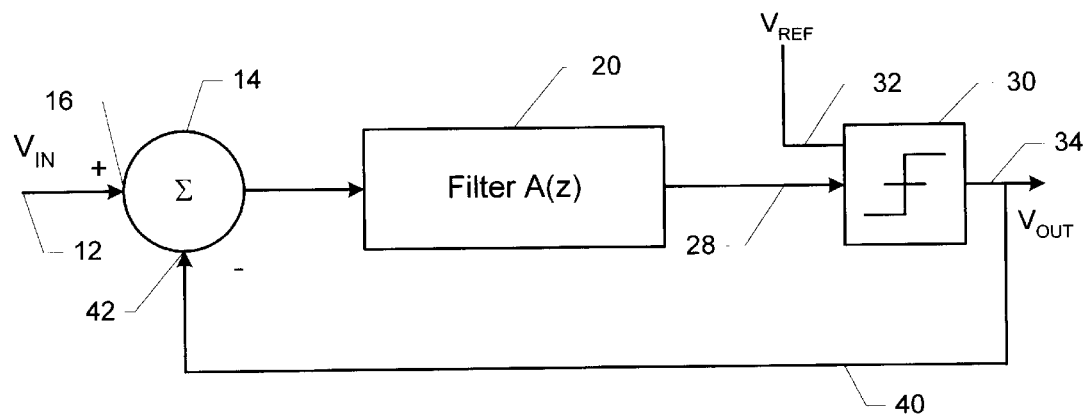
FIG. 1 is an electrical schematic diagram illustrating a simple prior art band pass $\Sigma\Delta$ modulator apparatus.

FIG. 1 is an electrical schematic diagram illustrating a simple prior art band pass $\Sigma\Delta$ modulator apparatus. In FIG. 1, a band pass $\Sigma\Delta$ modulator apparatus 10 is illustrated that substantially represents the $\Sigma\Delta$ modulator apparatus described in "Switched-Capacitor Bandpass Delta-Sigma A/D Modulation at 10.7 MHz", by Frank W. Singor and W. Martin Sneigrove; reference (1) cited above in the Background of the Invention section of this Specification. $\Sigma\Delta$ modulator apparatus 10 receives an analog signal $V_{IN}$ at an input locus 12. Signal $V_{IN}$ is provided to a signal combiner or summer 14 at a positive node 16. Signal combiner 14 provides an output signal via an output line 18 to a filter 20. Filter 20 includes provides an integrated signal output to a comparator 30 via an output line 28. Comparator 30 receives a reference voltage $V_{REF}$ at an input node 32. Comparator 30 compares the signal received via output line 28 from filter 20 with reference voltage $V_{REF}$ and generates a digital output signal VOUT at an output locus 34 representing the result of that comparison. Output signal $V_{OUT}$ is provided via a feedback line 40 to a negative node 42 of signal combiner 14.

Figure 2:
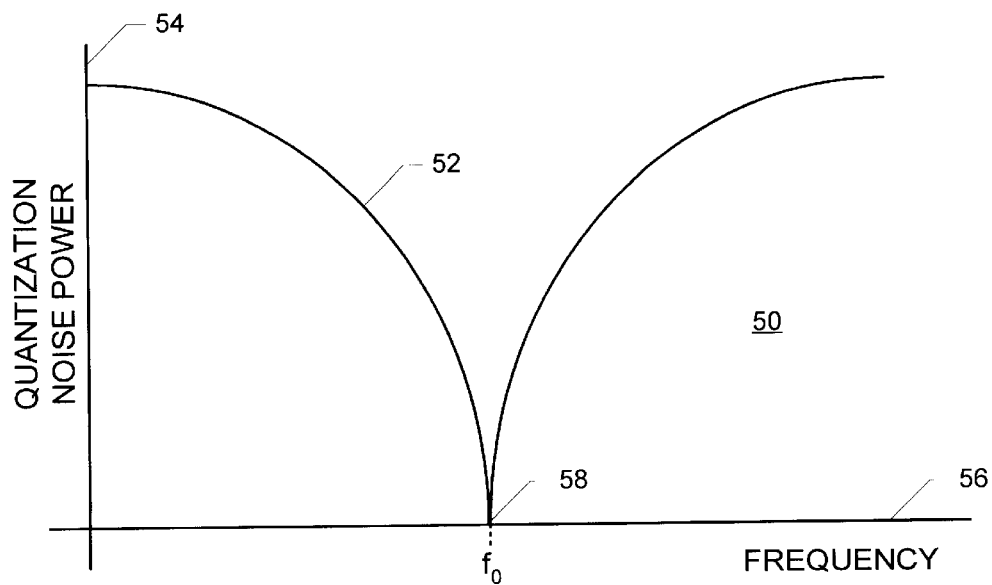
FIG. 2 is a graphic plot schematically representing the desired relationship between quantization noise power and frequency for the prior art band pass $\Sigma\Delta$ modulator apparatus illustrated in FIG. 1.

FIG. 2 is a graphic plot schematically representing the desired relationship between quantization noise power and frequency for the prior art band pass $\Sigma\Delta$ modulator apparatus illustrated in FIG. 1. In FIG. 2, a graphic plot 50 represents quantization noise power on a first axis 54 and represents frequency on a second axis 56. A curve 52 represents the desired the relationship between frequency and quantization noise power generated by apparatus 10 (FIG. 1) in that curve 52 exhibits a minimum quantization noise power locus 58 substantially at a frequency $f_0$. Quantization noise represents differences between an analog input signal and digital signals generated by an apparatus representing the analog input signal. Frequency $f_0$ is the center frequency of the intermediate frequency (IF) in which apparatus 10 is designed to operate. Thus, curve 52 illustrates a desirable goal that quantization noise power is at a minimum (preferably substantially at zero) at the center frequency $f_0$ of the IF band in which apparatus 10 is designed to operate.

One way that has been attempted to place a minimum quantization noise power locus (e.g., locus 58; FIG. 2) at a center operating frequency (e.g., frequency $f_0$; FIG. 2) has been to employ $\Sigma\Delta$ modulators in n-path configurations. Such n-path configurations typically produce a greater number of minimum power loci from which to choose in selecting a desired center operating frequency.

Figure 3:
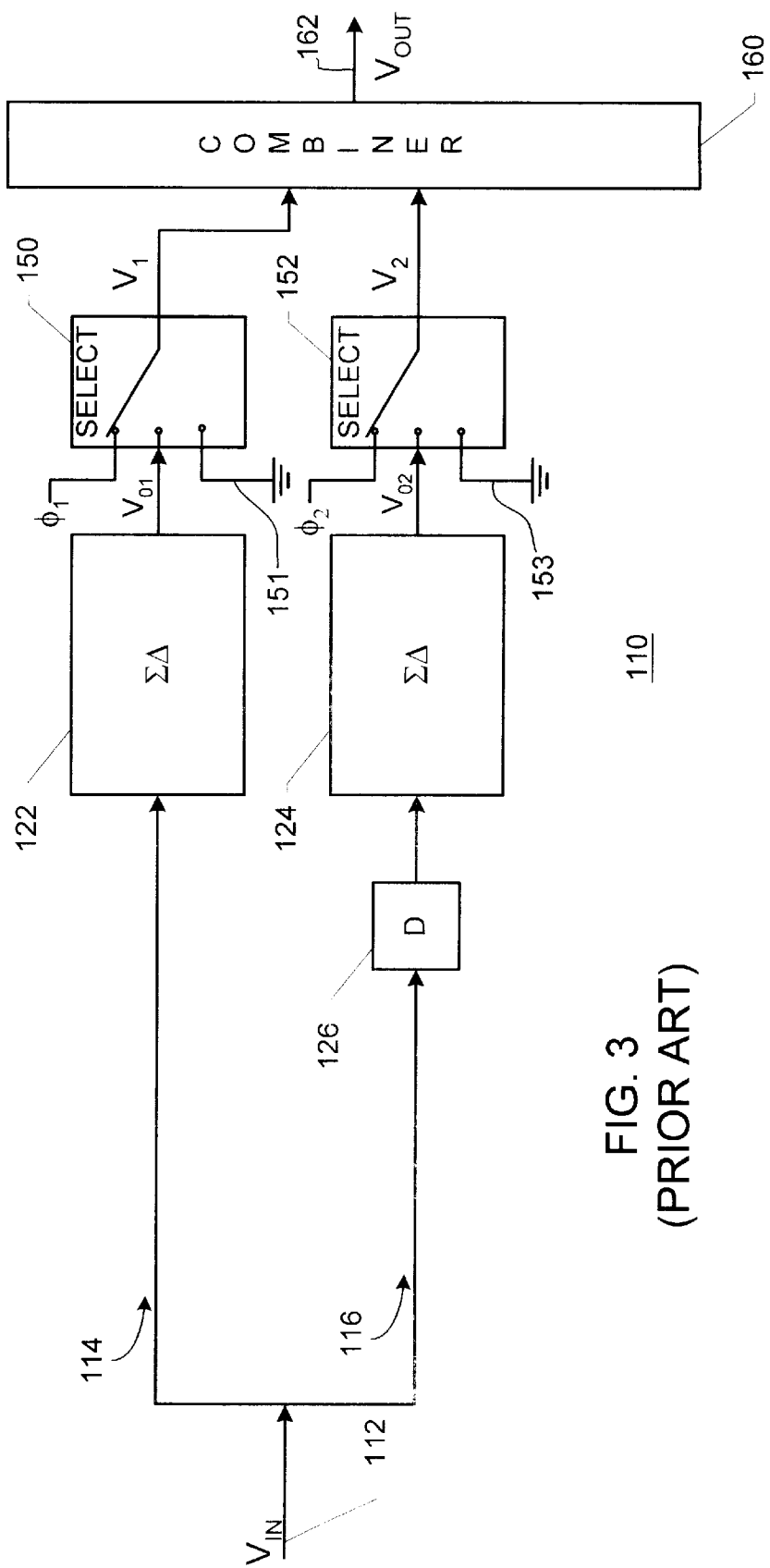
FIG. 3 is a schematic diagram illustrating a representative prior art implementation of a multi-path $\Sigma\Delta$ modulator apparatus.

FIG. 3 is a schematic diagram illustrating a representative prior art implementation of a multi-path $\Sigma\Delta$ modulator apparatus. In FIG. 3, an n-path conversion apparatus 110 receives an analog input signal $V_{IN}$ at an input locus 112. Apparatus 110 presents two signal paths 114, 116 for receiving input signal $V_{IN}$. Signal path 114 includes a $\Sigma\Delta$ modulator device 122. Signal path 116 includes a $\Sigma\Delta$ modulator device 124 and a signal delay device 126. Signal delay device 126 imposes a one-cycle delay to signals so that signal path 116 delays signals to $\Sigma\Delta$ modulator device 124. Thus, $\Sigma\Delta$ modulator device 122 receives signals undelayed with respect to signals appearing at input locus 112. $\Sigma\Delta$ modulator device 124 receives signals delayed one cycle with respect to signals appearing at input locus 112.

$\Sigma\Delta$ modulators 122, 124 generate output signals $V_{O1}$, $V_{O2}$ and provide output signals to selection devices 150, 152. A first control signal $\phi_1$ is provided to selection device 150, and selection device 150 is configured for coupling to ground at a ground terminal 151. A second control signal $\phi_2$ is provided to selection device 152, and selection device 152 is configured for coupling to ground at a ground terminal 153. Selection device 150 responds to first control signal $\phi_1$ being at a first signal level to provide an output signal $V_1$ to a combiner device 160, or selection device 150 responds to first control signal $\phi_1$ being at a second signal level to provide a zero signal (indicating connection by selection device 150 to ground) to combiner device 160. Selection device 152 responds to second control signal $\phi_2$ being at a first signal level to provide an output signal $V_2$ to combiner device 160, or selection device 152 responds to second control signal $\phi_2$ being at a second signal level to provide a zero signal (indicating connection by selection device 152 to ground) to combiner device 160. Establishing control signals $\phi_1$, $\phi_2$ at appropriate signal levels for operating apparatus 110 is effected by a control unit (not shown in FIG. 3) according to a predetermined program or other arrangement. Combiner device 160 combines its input signals $V_1$, $V_2$ to generate an output signal $V_{out}$ at an output locus 162.

Figure 4:
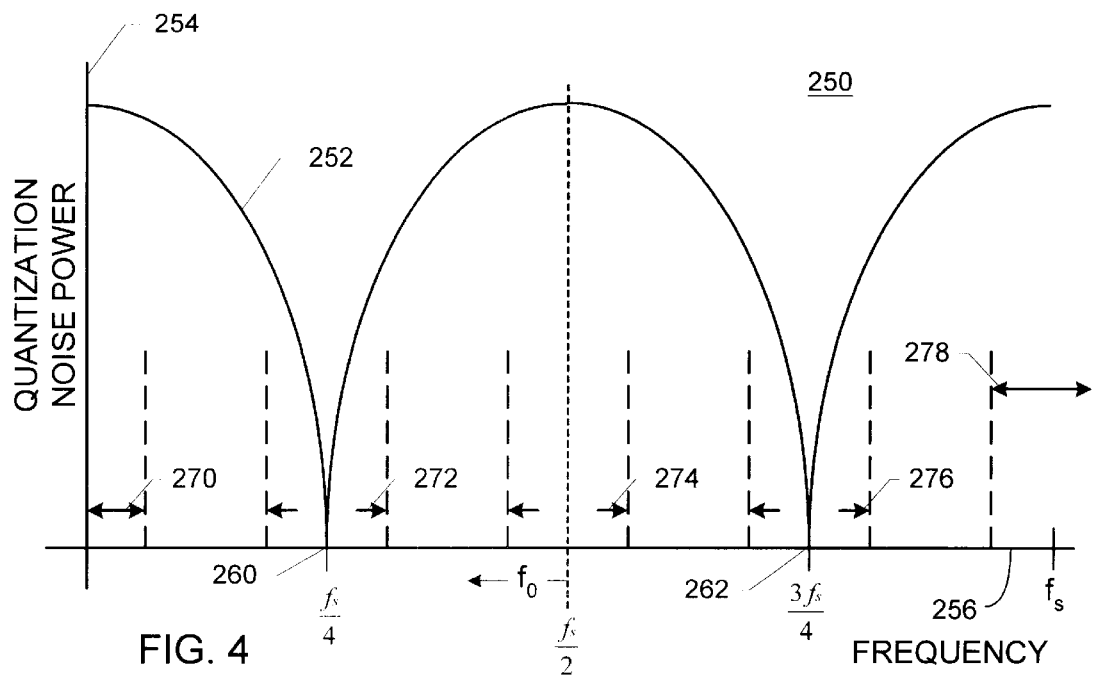
FIG. 4 is a graphic plot schematically representing the relationship between quantization noise power and frequency for the prior art multi-path $\Sigma\Delta$ modulator apparatus illustrated in FIG. 3.

FIG. 4 is a graphic plot schematically representing the relationship between quantization noise power and frequency for the prior art multi-path $\Sigma\Delta$ modulator apparatus illustrated in FIG. 3. In FIG. 4, a graphic plot 250 represents quantization noise power on a first axis 254 and represents frequency on a second axis 256. A curve 252 represents the relationship between frequency and quantization noise power generated by apparatus 110 (FIG. 3). Curve 52 exhibits minimum quantization noise power loci 260, 262 indicating that apparatus 110 generates least quantization noise power at $$\frac{f_s}{4}$$

and at $$\frac{3f_s}{4}$$

($f_s$ is the sampling frequency employed by apparatus 110). Employing Nyquist sampling to avoid aliasing one may select a center frequency $f_0$ at a frequency of $$\frac{f_s}{2}$$

or less.

Recall that tones are typically caused by mismatches between paths within the apparatus (e.g., signal paths 114, 116 in apparatus 110; FIG. 3). For a 2-path system, such tones are generated about zero, $$\frac{f_s}{4}, \frac{f_s}{2}, \frac{3f_s}{4},$$

and $f_s$ where $f_s$ is the sampling frequency. Thus, as illustrated in FIG. 4, tones are generated in frequency ranges 270 (in the vicinity of zero), 272 (in the vicinity of frequency $$\frac{f_s}{2},$$

274 (in the vicinity of frequency $$\frac{f_s}{2}\Big),$$

276 (in the vicinity of frequency $$\frac{3f_s}{4}\Big),$$

and 278 (in the vicinity of sampling frequency $f_s$). A significant shortcoming with apparatus 110 is that minimum quantization noise power loci occur at precisely the frequencies where tones are generated. As a consequence, one cannot select a center operating frequency $f_0$ at a locus at which quantization noise power is minimal that gives most efficient performance by n-path apparatus 110 without encountering tones that will interfere with operation of apparatus 110. Thus, curve 252 indicates that the n-path architecture employed in apparatus 110 succeeds in producing multiple minimum quantization noise power loci 260, 262. However, selecting center frequency $f_0$ to be coincident with any quantization noise power locus 260 is counterproductive to efficient operation of apparatus 110. Minimum quantization noise power locus 262 is not a candidate for locating center frequency $f_0$ because it is above frequency.

$$\frac{f_s}{2}.$$

Whenever a minimum quantization noise power locus 260, 262 occurs at a frequency displaced from center frequency $f_0$, there is more than minimal power used by apparatus 110 at center frequency $f_0$, yet placement of center frequency $f_0$ at a minimum quantization noise power locus 260 invites interference from mismatch generated tones from apparatus 110. Under such conditions apparatus 110 cannot operate as economically as possible. As mentioned earlier in connection with FIG. 2, it is an important design goal to have a minimum quantization noise power locus 260, 262 occur substantially at center frequency $f_0$. It is also important that other noise sources, such as self-generated tones from operating the apparatus being designed, not appear at the minimum quantization noise power loci.

Figure 5:
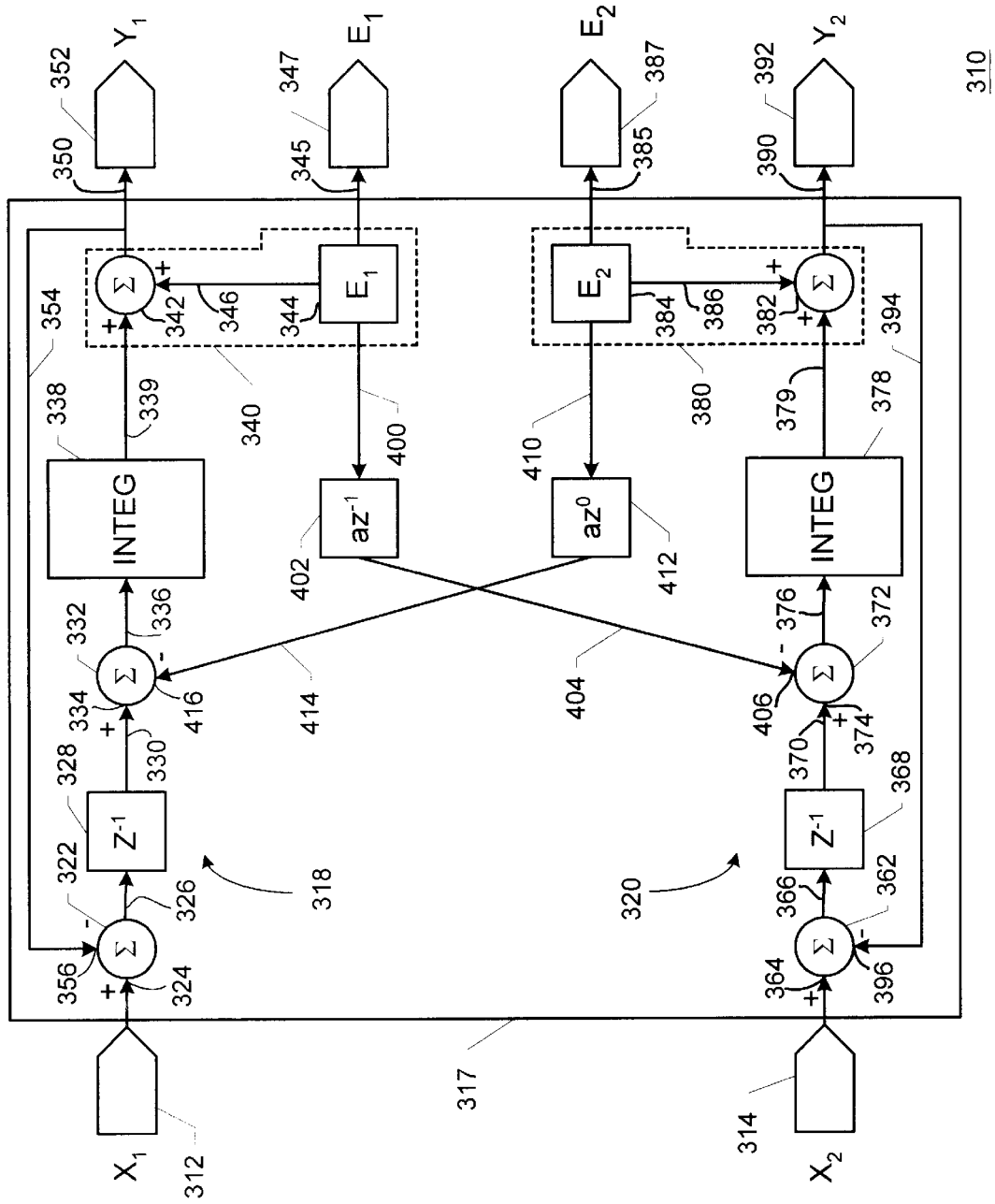
FIG. 5 is a schematic diagram illustrating the preferred embodiment of the apparatus of the present invention.

FIG. 5 is a schematic diagram illustrating the preferred embodiment of the apparatus of the present invention. In FIG. 5, an analog-to-digital conversion apparatus 310 receives sampled analog input signals $X_1$, $X_2$ at input loci 312, 314. Input signals $X_1$, $X_2$ are time-displaced by one-half clock cycle. Apparatus 310 includes a first $\Sigma\Delta$ modulator circuit 318 and a second $\Sigma\Delta$ modulator circuit 320 upon a single substrate 317.

First $\Sigma\Delta$ modulator circuit 318 is coupled with input locus 312. Signal $X_1$ is provided from first input locus 312 to a signal combiner or summer 322 at a positive node 324. Signal combiner 322 provides an output signal via an output line 326 to a delay filter 328. Delay filter 328 provides a signal via an output 330 to a signal combiner or summer 332 at a positive node 334. The signal appearing at output 330 from delay filter 328 is delayed one cycle with respect to the signal appearing on output line 326 from signal combiner 322. Signal combiner 332 provides an output signal via an output line 336 to an integrator 338. Integrator 338 integrates the signal appearing on output line 336 and provides an integrated signal output to a quantizer 340 via an output line 339. Quantizer 340 includes a signal combiner 342 and an error generator 344. Error generator 344 generates an error signal on a line 346 that represents quantization error in signals appearing on line 339. Signal combiner 342 combines integrated signals appearing on line 339 with error signals appearing on line 346 to generate a digital output signal on an output line 350. The digital output signal $Y_1$ appearing on line 350 is provided to output locus 352 and also via feedback line 354 to signal combiner 322 at a negative node 356. Error generator 344 also provides an error signal on a line 345 to an error output locus 347 for presenting a signal $E_1$ for use in cascaded configurations using apparatus 310.

Second $\Sigma\Delta$ modulator circuit 320 is coupled with input locus 314. Signal $X_2$ is provided from first input locus 314 to a signal combiner or summer 362 at a positive node 364. Signal combiner 362 provides an output signal via an output line 366 to a delay filter 368. Delay filter 368 provides a signal via an output 370 to a signal combiner or summer 372 at a positive node 374. The signal appearing at output 370 from delay filter 368 is delayed one cycle with respect to the signal appearing on output line 366 from signal combiner 362. Signal combiner 372 provides an output signal via an output line 376 to an integrator 378. Integrator 378 integrates the signal appearing on output line 376 and provides an integrated signal output to a quantizer 380 via an output line 379. Quantizer 380 includes a signal combiner 382 and an error generator 384. Error generator 384 generates an error signal on a line 386 that represents quantization error in signals appearing on line 379. Signal combiner 382 combines integrated signals appearing on line 379 with error signals appearing on line 386 to generate a digital output signal on an output line 390. The digital output signal $Y_2$ appearing on line 390 is provided to output locus 392 and also via feedback line 394 to signal combiner 362 at a negative node 396. Error generator 384 also provides an error signal on a line 385 to an error output locus 387 for presenting a signal $E_2$ for use in cascaded configurations using apparatus 310.

A novel cross-connection is effected between first $\Sigma\Delta$ modulator circuit 318 and second $\Sigma\Delta$ modulator circuit 320. Error generator 344 provides an error signal via a line 400 to a delay unit 402. Delay unit 402 imposes a delay upon the signal received via line 400 to produce a delayed feedback signal on a line 404 to signal combiner 372 at a negative node 406. Error generator 384 provides an error signal via a line 410 to a delay unit 412. Delay unit 412 imposes a delay upon the signal received via line 410 to produce a delayed feedback signal on a line 414 to signal combiner 332 at a negative node 416. The delay imposed by delay unit 402 is one cycle greater than the delay imposed by delay unit 412. Preferably, delay unit 402 imposes a one-cycle delay and delay unit 412 imposes zero delay.

Thus, apparatus 310 (FIG. 5) is a second order cross-coupled 2-path $\Sigma\Delta$ modulator. Compared with a traditional prior art 2-path $\Sigma\Delta$ modulator a significant difference with apparatus 310 is in the cross-coupling arrangement by which quantization error $E_1$ of a first path ($\Sigma\Delta$ modulator circuit 318) is provided as feedback to the second path ($\Sigma\Delta$ modulator circuit 320) after one clock delay (delay unit 402; delay $az^{-1}$), and quantization error $E_2$ of the second path ($\Sigma\Delta$ modulator circuit 320) is provided as feedback to the first path ($\Sigma\Delta$ modulator circuit 318) with no clock delay (delay unit 412; delay $az^0$). Since second $\Sigma\Delta$ modulator circuit 320 is delayed by one-half clock cycle relative to first $\Sigma\Delta$ modulator circuit 318 by the one-half clock delay of input signal $X_2$ at input locus 314 with respect to input signal $X_1$ at input locus 312, the error for each path is provided as a feedback signal for the other path after a one-half clock cycle delay.

Figure 6:
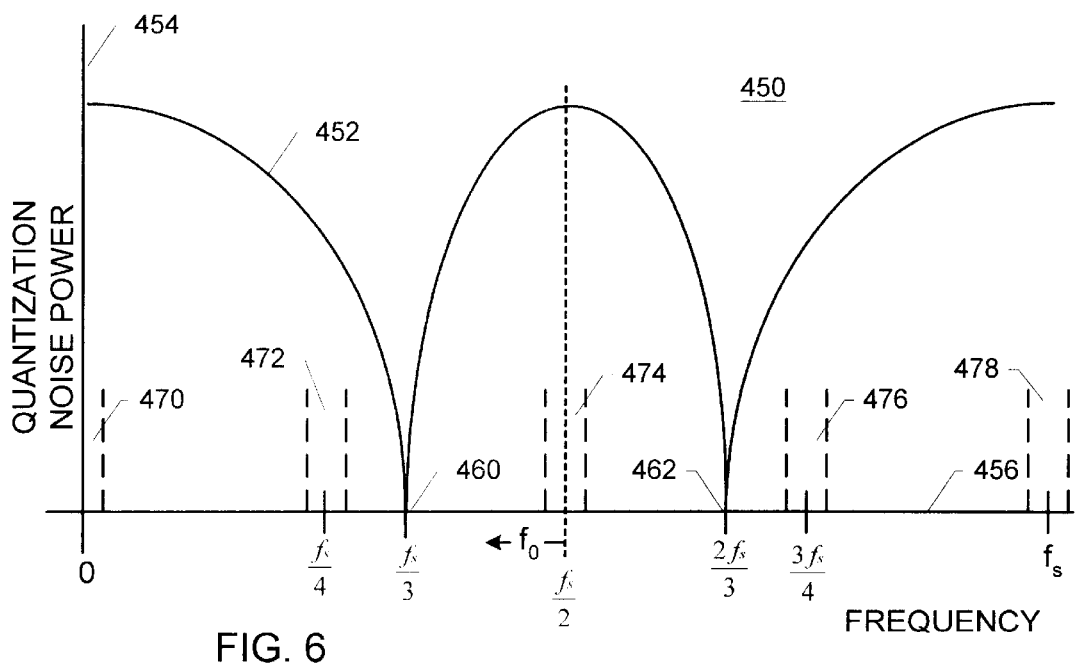
FIG. 6 is a graphic plot schematically representing the relationship between quantization noise power and frequency for the apparatus illustrated in FIG. 5.

FIG. 6 is a graphic plot schematically representing the relationship between quantization noise power and frequency for the apparatus illustrated in FIG. 5. In FIG. 6, graphic plot 450 represents quantization noise power on a first axis 454 and represents frequency on a second axis 456. A curve 452 represents the relationship between frequency and quantization noise power generated by apparatus 310 (FIG. 5). Curve 452 exhibits minimum quantization noise power loci 460, 462 indicating that apparatus 310 generates least quantization noise power at $$\frac{f_s}{3} \text{ and at } \frac{2f_s}{3}$$

($f_s$ is the sampling frequency employed by apparatus 310). Employing Nyquist sampling to avoid aliasing one may select a center frequency $f_0$ at a frequency of $$\frac{f_s}{2}$$

or less.

Recall that tones are typically caused by mismatches between paths within the apparatus (e.g., modulator circuits 318, 320 in apparatus 310; FIG. 5). Such tones are generated about zero, $$\frac{f_s}{4}, \frac{f_s}{2}, \frac{3f_s}{4},$$

and $f_s$, where $f_s$ is the sampling frequency. Thus, as illustrated in FIG. 6, tones are generated in frequency ranges 470 (in the vicinity of zero), 472 (in the vicinity of frequency $$\frac{f_s}{4},$$

474 (in the vicinity of frequency $$\frac{f_s}{2}$$),

476 (in the vicinity of frequency $$\frac{3f_s}{4}$$), and 478 (in the vicinity of sampling frequency $f_s$).

The significant advantage with the performance of apparatus 310 is that minimum quantization noise power loci 460, 462 occur at frequencies that are significantly displaced from where tones are generated (i.e., frequency ranges 470, 472, 474, 476, 478). As a consequence, one can select a center operating frequency $f_0$ at a locus at which quantization noise power is minimal that gives most efficient performance by apparatus 310 without encountering tones that will interfere with operation of apparatus 310. Curve 452 indicates that the cross-connected n-path architecture employed in apparatus 310 succeeds in producing multiple minimum quantization noise power loci 460, 462. Center frequency $f_0$ may be chosen at a value less than $$\frac{f_s}{2}$$

to facilitate effecting Nyquist sampling. Thus, center frequency $f_0$ may be set at frequency $$\frac{f_s}{3}$$

(coincident with quantization noise power minimum locus 460) and be displaced from tones generated in frequency ranges 472, 474.

Because center frequency $f_0$ occurs at a frequency coincident with minimum quantization noise power locus 460, there is minimal quantization noise power generated by apparatus 310 at center frequency $f_0$. Further, placement of center frequency $f_0$ at minimum quantization noise power locus 460 avoids interference from self generated tones from apparatus 310 present in frequency range 472 (in the vicinity of frequency $$\frac{f_s}{4}$$

and in frequency range 474 (in the vicinity of frequency $$\frac{f_s}{2}$$).

Under such conditions apparatus 310 can operate as economically as possible.

Two important design goals are met by apparatus 310. Minimum quantization noise power locus 460 occurs substantially at center frequency $f_0$, and self-generated tones from operating apparatus 310 do not appear at or near minimum quantization noise power locus 460.

The following expression describes the transfer function of the first path (ΣΔ modulator circuit 318) assuming a=1 (delay unit 402; FIG. 5):

$$[(X_1 + Y_1)z^{-1} + E_2]\frac{1}{1+z^{-1}} + E_1 = Y_1 \quad [1]$$

Expression [1] may be restated as:

$$Y_1 = X_{1z}^{-1} + E_2 + (1+z^{-1})E_1 \quad [2]$$

If one changes the notation in expression [2] t use the system clock frequency, expression [2] may be stated as:

$$Y_1 = X_{1z}^{-2} + E_2 + (1+z^{-2})E_1 \quad [3]$$

Similarly, the transfer function of the second path (ΣΔ modulator circuit 320) may be expressed in a form similar to expression [3], also assuming a=1 (delay unit 412; FIG. 5), as:

$$Y_2 = X_{2z}^{-2} + E_{1z}^{-2} + (1+z^{-2})E_2 \quad [4]$$

A first order ΣΔ analog-to-digital converter can be built using apparatus 310 (FIG. 5) by adding down-sampling at the input and up-sampling at the output of such a converter. FIG. 7 illustrates such a converter.

FIG. 7 is a schematic diagram illustrating a representative employment of the apparatus illustrated in FIG. 5 in a system for effecting analog-to-digital signal conversion. In FIG. 7, an analog-to-digital converter apparatus 700 includes a cross-coupled converter device 701 of the sort described in connection with FIG. 5. Cross-coupled converter device 701 has input loci 702, 704 and output loci 706, 708. Error signal output loci 707, 709 are also provided for use in cascadingly combining a plurality of converter devices constructed similarly to converter device 701.

An analog input signal X is provided at an input locus 710. Input locus 710 is coupled to provide input signal X to a first down-sampling unit 712 and a second down-sampling unit 714. Signal X is delayed by a half-cycle by a delay unit 711. Down-sampling units 712, 714 down-sample input signal X by a factor of two. Thus, input signals $X_1$, $X_2$ to converter device 701 are sampled analog signals; signal $X_1$ is delayed with respect to signal $X_1$ by one clock cycle.

Converter device treats input signals $X_1$, $X_2$ substantially as described in connection with apparatus 310 (FIG. 5) to present error signals $E_1$, $E_2$ at error signal output loci 707, 709 and digital output signals $Y_1$, $Y_2$ at output loci 706, 708. Digital output signal $Y_1$ is provided to an up-sampling unit 720. Digital output signal $Y_2$ is provided to an up-sampling unit 722. Up-sampling units 720, 722 up-sample digital output signals $Y_1$, $Y_2$ by a factor of two. An up-sampled signal is provided from up-sampling unit 722 to a signal combiner or summer 726. Up-sampling unit 720 provides an up-sampled signal to a delay unit 724; delay unit 724 imposes a delay upon the up-sampled signal provided from up-sampling unit 720. This delay is imposed by delay unit 724 on a signal ($Y_1$) that is derived from input sampled signal $X_1$. Note that the delay imposed by delay unit 711 is imposed upon input sampled signal $X_2$. Thus, the delays imposed by delay unit 711 (imposed upon input signal $X_2$) and imposed by delay unit 24 (imposed on output signal $Y_1$) substantially offset each other. Signal combiner 726 presents a combined digital output signal Y at an output locus 728. Output signal Y is a digital representation of analog input signal X.

Thus, analog-to-digital converter apparatus 700 exhibits a system transfer function that may be expressed as:

$$Y = Y_1 z^{-1} + Y_2 \quad [5]$$

Substituting terms from expressions [3] and [4]:

$$Y = X_z^{-2} + z^{-1}(z^{-2} + z^{-1} + 1)E_1 + (z^{-2} + z^{-1} + 1)E_2 \quad [6]$$

Higher order analog-to-digital conversion can be effected by coupling a plurality of conversion apparatuses 310 in a cascading combination. Such higher order conversion established sharper peaks to yield greater selectivity of signals for conversion. Higher order conversion alone does not affect placement of quantization noise power minimum loci or location of tones.

Figure 8:
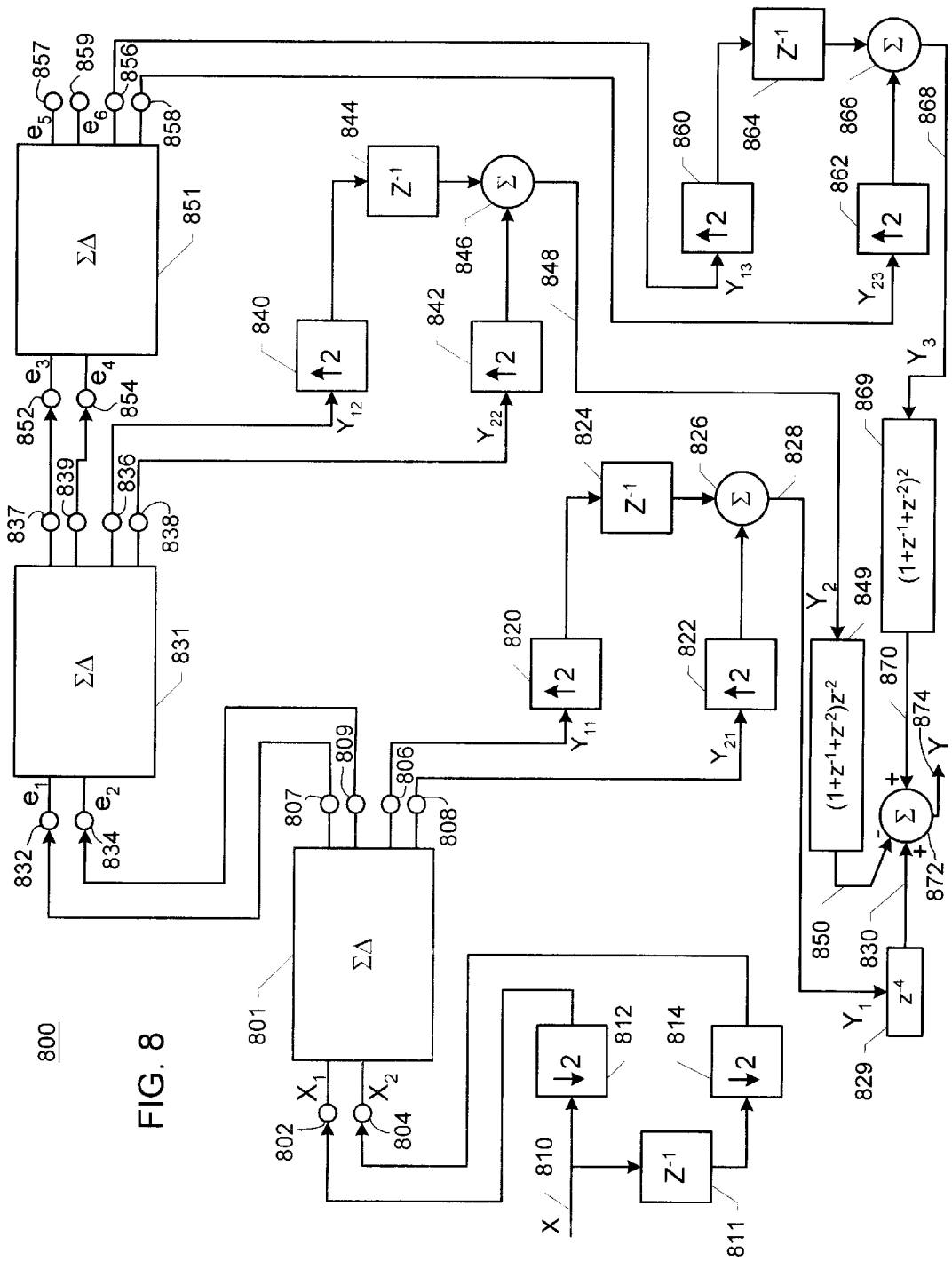
FIG. 8 is a schematic diagram illustrating a multiple cascading combination of three units of the apparatus of the present invention for effecting analog-to-digital conversion.

FIG. 8 is a schematic diagram illustrating a multiple cascading combination of three units of the apparatus of the present invention for effecting analog-to-digital conversion. In FIG. 8, an analog-to-digital converter apparatus 800 includes a cross-coupled converter device 801 of the sort described in connection with FIG. 5. Cross-coupled converter device 801 has input loci 802, 804. Cross-coupled converter device 801 also has output loci 806, 808 and error signal output loci 807, 809.

An analog input signal X is provided at input locus 810. Input locus 810 is coupled to provide input signal X to a first down-sampling unit 812 and a second down-sampling unit 814. Signal X is delayed by a half-cycle by a delay unit 811. Down-sampling units 812, 814 down-sample input signal X by a factor of two. Thus, input signals $X_1$, $X_2$ to converter device 801 are sampled analog signals; signal $X_2$ is delayed with respect to signal $X_1$ by one clock cycle.

Converter device 801 treats input signals $X_1$, $X_2$ substantially as described in connection with apparatus 310 (FIG. 5) to present error signal $e_1$ at error signal output locus 807 and to present error signal $e_2$ at error signal output locus 809. Converter device 801 further treats input signals $X_1$, $X_2$ to present digital output signal $Y_{11}$ at output locus 806 and to present digital output signal $Y_{21}$ at output locus 808. Digital output signal $Y_{11}$ is provided to an up-sampling unit 820. Digital output signal $Y_{21}$ is provided to an up-sampling unit 822. Up-sampling units 820, 822 up-sample digital output signals $Y_{11}$, $Y_{21}$ by a factor of two. An up-sampled signal is provided from up-sampling unit 822 to a signal combiner or summer 826. Up-sampling unit 820 provides an up-sampled signal to a delay unit 824; delay unit 824 imposes a delay upon the up-sampled signal provided from up-sampling unit 820. This delay is imposed by delay unit 824 on a signal ($Y_{11}$) that is derived from input sampled signal $X_1$. Note that the delay imposed by delay unit 811 is imposed upon input sampled signal $X_2$. Thus, the delays imposed by delay unit 811 (imposed upon input signal $X_2$) and imposed by delay unit 824 (imposed on output signal $Y_{11}$) substantially offset each other. Signal combiner 826 presents a combined digital first iteration output signal $Y_1$ at an output locus 828. First iteration output signal $Y_1$ is a first iteration digital representation of sampled analog input signals $X_1$, $X_2$. A filter unit 829 imposes a delay $z^{-4}$ upon first iteration output signal $Y_1$ and presents a conditioned first iteration output signal on a line 830 to a signal combiner or summer 872.

Analog-to-digital converter apparatus 800 further includes a cross-coupled converter device 831 of the sort described in connection with FIG. 5. Cross-coupled converter device 831 has input loci 832, 834. Cross-coupled converter device 831 also has output loci 836, 838 and error signal output loci 837, 839.

An input signal $e_1$ is provided at input locus 832 from error signal output locus 807 of converter device 801. An input signal $e_2$ is provided at input locus 834 from error signal output locus 809 of converter device 801. Signal $e_2$ is delayed with respect to signal $e_1$ by one clock cycle.

Converter device 831 treats input signals $e_1$, $e_2$ substantially as described in connection with apparatus 310 (FIG. 5) to present error signal $e_3$ at error signal output locus 837 and to present error signal $e_4$ at error signal output locus 839. Converter device 831 further treats input signals $e_1$, $e_2$ to present digital output signal $Y_{12}$ at output locus 836 and to present digital output signal $Y_{22}$ at output locus 838. Digital output signal $Y_{12}$ is provided to an up-sampling unit 840. Digital output signal $Y_{22}$ is provided to an up-sampling unit 842. Up-sampling units 840, 842 up-sample digital output signals $Y_{12}$, $Y_{22}$ by a factor of two. An up-sampled signal is provided from up-sampling unit 842 to a signal combiner or summer 846. Up-sampling unit 840 provides an up-sampled signal to a delay unit 844; delay unit 844 imposes a delay upon the up-sampled signal provided from up-sampling unit 840. This delay is imposed by delay unit 844 on a signal ($Y_{12}$) that is derived from input signal $e_1$. Signal combiner 846 presents a combined digital second iteration output signal $Y_2$ at an output locus 848. Second iteration output signal $Y_2$ is a second iteration digital representation of sampled analog input signals $X_1$, $X_2$. A filter unit 849 imposes a delay $[(1+z^{-1}+z^{-2})z^{-2}]$ upon second iteration output signal $Y_2$ and presents a conditioned second iteration output signal on a line 850 to signal combiner or summer 872.

Analog-to-digital converter apparatus 800 still further includes a cross-coupled converter device 851 of the sort described in connection with FIG. 5. Cross-coupled converter device 851 has input loci 852, 854. Cross-coupled converter device 851 also has output loci 856, 858 and error signal output loci 857, 859.

An input signal $e_3$ is provided at input locus 852 from error signal output locus 837 of converter device 831. An input signal $e_4$ is provided at input locus 854 from error signal output locus 839 of converter device 831. Signal $e_4$ is delayed with respect to signal $e_3$ by one clock cycle.

Converter device 851 treats input signals $e_3$, $e_4$ substantially as described in connection with apparatus 310 (FIG. 5) to present error signal $e_5$ at error signal output locus 857 and to present error signal $e_6$ at error signal output locus 859. Error signals $e_5$, $e_6$ are available for further cascading connection, if desired (not shown in FIG. 8). Converter device 851 further treats input signals $e_3$, $e_4$ to present digital output signal $Y_{13}$ at output locus 856 and to present digital output signal $Y_{23}$ at output locus 858. Digital output signal $Y_{13}$ is provided to an up-sampling unit 860. Digital output signal $Y_{23}$ is provided to an up-sampling unit 862. Up-sampling units 860, 862 up-sample digital output signals $Y_{13}$, $Y_{23}$ by a factor of two. An up-sampled signal is provided from up-sampling unit 862 to a signal combiner or summer 866. Up-sampling unit 860 provides an up-sampled signal to a delay unit 864; delay unit 864 imposes a delay upon the up-sampled signal provided from up-sampling unit 860. This delay is imposed by delay unit 864 on a signal ($Y_{13}$) that is derived from input signal $e_3$. Signal combiner 866 presents a combined digital third iteration output signal $Y_3$ at an output locus 868. Third iteration output signal $Y_3$ is a third iteration digital representation of sampled analog input signals $X_1$, $X_2$. A filter unit 869 imposes a delay $[(1+z^{-1}+z^{-2})^2]$ upon third iteration output signal $Y_3$ and presents a conditioned third iteration output signal on a line 870 to signal combiner or summer 872.

Signal combiner 872 combines the conditioned first iteration output signal appearing on line 830 with the conditioned second iteration output signal appearing on line 850 and with the third iteration output signal appearing on line 870 to produce an output signal Y at an output node 874. Output signal Y is a digital representation of input signal X appearing at input node 810.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

We claim:

1. An apparatus for generating at least one digital output signal representative of an analog signal; the apparatus comprising:
   (a) a plurality of conversion units; each respective conversion unit of said plurality of conversion units including a respective input locus, a respective first summing section coupled with said respective input locus, a respective delay section coupled with said respective first summing section, a respective second summing section coupled with said respective delay section and a respective integrator section coupled with said respective second summing section; each said respective conversion unit receiving a respective sampled analog input signal at said respective input locus; said respective sampled analog input signal being a sampling of said analog signal; each said respective sampled analog signal being phase-offset with respect to other said respective sampled analog signals; each said respective conversion unit treating said respective sampled analog input signal using said respective first summing section, said respective delay section, said respective second summing section, and said respective integrator section to generate a respective digital output signal of said at least one digital output signal; a respective integrator output signal from said respective integrator unit being provided to said respective first summing section;
   (b) a respective error determination unit coupled with each said respective conversion unit; each said respective error determination unit determining an error associated with said respective integrator output signal; and
   (c) a respective feedback unit coupled with each said respective error determination unit; a first said respective feedback unit in a first said respective conversion unit being coupled with said respective second summing section in a second said respective conversion unit; a second said respective feedback unit in said second respective conversion unit being coupled with said respective second summing section in said first respective conversion unit; each said respective feedback unit asserting a respective predetermined amount of delay to signals handled by said respective feedback unit.

2. An apparatus for generating at least one digital output signal representative of an analog signal as recited in claim 1 wherein said error is a quantization error.

3. An apparatus for generating at least one digital output signal representative of an analog input signal as recited in claim 1 wherein said analog signal is characterized by a center frequency; wherein said respective predetermined amount of delay for said first respective feedback unit and for said second respective feedback unit are selected to minimize power density spectrum of a resultant digital output signal generally at said center frequency; said resultant digital output signal being derived from a summing of said first respective digital output signal and said second respective digital output signal.

4. An apparatus for generating at least one digital output signal representative of an analog input signal as recited in claim 3 wherein said predetermined amount of delay asserted by said first respective feedback unit is not equal with said predetermined amount of delay asserted by said second respective feedback unit.

5. An apparatus for generating at least one digital output signal representative of an analog input signal as recited in claim 4 wherein said error is a quantization error.

6. An apparatus for generating at least one digital output signal representative of an analog input signal; said analog input signal being characterized by a respective center frequency; the apparatus comprising:
   (a) a plurality of conversion units; each respective conversion unit of said plurality of conversion units including a respective input locus, a respective integrator section and a respective output locus presenting a respective digital output signal of said at least one digital output signal; each said respective integrator section having a respective integrator input locus;
   (b) a respective error determination unit coupled with each said respective output locus; each said respective error determination unit determining an error associated with said respective digital output signal; and
   (c) a respective feedback unit coupled with each said respective error determination unit; a first said respective feedback unit coupled with a first said respective conversion unit being coupled with said respective integrator input locus in a second said respective conversion unit; a second said respective feedback unit coupled with said second respective conversion unit being coupled with said respective integrator input locus in said first respective conversion unit; each said respective feedback unit asserting a respective predetermined amount of delay to signals handled by said respective feedback unit.

7. An apparatus for generating at least one digital output signal representative of an analog input signal as recited in claim 6 wherein said error is a quantization error.

8. An apparatus for generating at least one digital output signal representative of an analog input signal as recited in claim 6 wherein said respective predetermined delay for each said respective feedback unit is selected to minimize power density spectrum a resultant digital output signal generally at said center frequency; said resultant digital output signal being derived from a summing of a first respective digital output signal associated with said first respective conversion unit and a second respective digital output signal associated with said second respective conversion unit.

9. An apparatus for generating at least one digital output signal representative of an analog input signal as recited in claim 8 wherein said predetermined amount of delay asserted by said first respective feedback unit is not equal with said predetermined amount of delay asserted by said second respective feedback unit.

10. An apparatus for generating at least one digital output signal representative of an analog input signal as recited in claim 9 wherein said error is a quantization error.

11. An analog-to-digital signal conversion apparatus for generating at least one digital output signal representative of an analog input signal; said analog input signal being characterized by a respective center frequency; the apparatus comprising:

(a) a first conversion unit;

(b) a second conversion unit;

(c) said first conversion unit including a first input locus, a first integrator section and a first output locus presenting a first digital output signal of said at least one digital output signal; said first integrator section having a first integrator input locus; said first conversion unit receiving a first sampled analog signal derived from said analog input signal;

(d) said second conversion unit including a second input locus, a second integrator section and a second output locus presenting a second digital output signal of said at least one digital output signal; said second integrator section having a second integrator input locus; said second conversion unit receiving a second sampled analog signal derived from said analog input signal; said second sampled analog signal being phase-offset with respect to said first sampled analog signal;

(e) a first feedback unit coupling said first output locus with said second integrator input locus; said first feedback unit asserting a respective predetermined amount of delay to signals provided by said first feedback unit to said second integrator input locus;

(f) a second feedback unit coupling said second output locus with said first integrator input locus; said second feedback unit asserting a respective predetermined amount of delay to signals provided by said second feedback unit to said first integrator input locus, wherein said signals provided by said first feedback unit to said second integrator input locus are based in a quantization error in said first digital output signal and wherein said signals provided by said second feedback unit to said first integrator input locus are based in a quantization error in said second digital output signal.

12. An apparatus for generating at least one digital signal representative of an analog input signal; the apparatus comprising:

(a) a first signal conversion device; said first signal conversion device including a first analog signal treatment section coupled with a first input locus and a first digital signal treatment section coupled between said first analog signal treatment section and a first output locus; said first signal conversion device receiving a first sampled analog signal derived from said analog input signal at said first input locus;

(b) a second signal conversion device; said second signal conversion device including a second analog signal treatment section coupled with a second input locus and a second digital signal treatment section coupled between said second analog signal treatment section and a second output locus; said second signal conversion device receiving a second sampled analog signal derived from said analog input signal at said second input locus; said first sampled analog signal and said second sampled analog signal being phase-offset by a first phase difference;

(c) a first feedback device; said first feedback device being coupled between said first output locus and said second analog treatment section; said first feedback device asserting a first delay to first feedback signals conveyed from said first output locus to said second analog treatment section; and (d) a second feedback device; said second feedback device being coupled between said second output locus and said first analog treatment section; said second feedback device asserting a second delay to second feedback signals conveyed from said second output locus to said first analog treatment section; said first delay and said second delay being phase-offset by a second phase difference; said first phase difference and said second phase difference cooperating to affect power density spectrum of a resultant digital output signal at at least one predetermined frequency; said resultant digital output signal being derived from a summing of a first digital output signal presented by said first signal conversion device at said first output locus and a second digital output signal presented by said second signal conversion device at said second output locus.

13. An apparatus for generating at least one digital signal representative of an analog input signal as recited in claim 12 wherein said analog input signal is substantially periodic and wherein first phase difference is substantially equal to one-half cycle of said analog input signal.

14. An apparatus for generating at least one digital signal representative of an analog input signal as recited in claim 12 wherein said analog input signal is substantially periodic and wherein said second phase difference is substantially equal to one cycle of said analog input signal.

15. An apparatus for generating at least one digital signal representative of an analog input signal as recited in claim 13 wherein said analog input signal is substantially periodic and wherein said second phase difference is substantially equal to one cycle of said analog input signal.

16. An apparatus for generating at least one digital signal representative of an analog input signal as recited in claim 12 wherein said first feedback signal and said second feedback signal each includes a quantization error.

17. An apparatus for generating at least one digital signal representative of an analog input signal as recited in claim 12 wherein said first phase difference and said second phase difference are selected to minimize said power density spectrum a resultant digital output signal generally at said center frequency.

18. An apparatus for generating at least one digital output signal representative of an analog input signal as recited in claim 17 wherein said first delay and said second delay are not equal.

19. An apparatus for generating at least one digital output signal representative of an analog input signal as recited in claim 18 wherein said first feedback signal and said second feedback signal each includes a quantization error.

* * * * *